(12) United States Patent (10) Patent No.: US 12,588,454 B2
Yamana et al. (45) Date of Patent: Mar. 24, 2026

(54) AlN CERAMIC SUBSTRATE AND HEATER FOR SEMICONDUCTOR MANUFACTURING APPARATUS

(71) Applicant: NGK Insulators, Ltd., Nagoya-City (JP)

(72) Inventors: Keita Yamana, Nagoya-City (JP); Kazuhiro Nobori, Handa-City (JP)

(73) Assignee: NGK INSULATORS, LTD., Nagoya (JP)

( * ) Notice: Subject to any disclaimer, the term of this patent is extended or adjusted under 35 U.S.C. 154(b) by 768 days.

(21) Appl. No.: 18/046,614

(22) Filed: Oct. 14, 2022

(65) Prior Publication Data

US 2023/0138000 A1 May 4, 2023

Related U.S. Application Data

(63) Continuation of application No. PCT/JP2021/040196, filed on Nov. 1, 2021.

(30) Foreign Application Priority Data

Mar. 18, 2021 (JP) ................................. 2021-044405

(51) Int. Cl.
*H01L 21/67* (2006.01)

(52) U.S. Cl.
CPC .............................. *H01L 21/67103* (2013.01)

(58) Field of Classification Search
CPC .... C04B 2235/3222; C04B 2235/3225; C04B 2235/6567; C04B 2235/661; C04B 2235/786; C04B 2235/80; C04B 2235/85; C04B 35/581; C04B 35/645; H01L 21/67103; H01L 21/68757

USPC ...................................................... 219/444, 1
See application file for complete search history.

(56) References Cited

U.S. PATENT DOCUMENTS

| | | | | |
|---|---|---|---|---|
| 5,773,377 A | * | 6/1998 | Harris | .................. C04B 35/581 |
| | | | | 501/153 |
| 5,998,321 A | * | 12/1999 | Katsuda | ................ C04B 35/581 |
| | | | | 501/98.4 |
| 10,403,535 B2 | | 9/2019 | Ye et al. | |
| 2003/0071260 A1 | * | 4/2003 | Ootsuka | ........... H01J 37/32009 |
| | | | | 257/44 |
| 2005/0215415 A1 | | 9/2005 | Hattori | |
| 2008/0142501 A1 | | 6/2008 | Morioka et al. | |

(Continued)

FOREIGN PATENT DOCUMENTS

| | | |
|---|---|---|
| JP | 2003-313078 A | 11/2003 |
| JP | 2005-281046 A | 10/2005 |

(Continued)

OTHER PUBLICATIONS

English translation of the International Preliminary Report on Patentability (Chapter I) dated Sep. 28, 2023 (Application No. PCT/JP2021/040196).

(Continued)

*Primary Examiner* — Sang Y Paik
(74) *Attorney, Agent, or Firm* — BURR PATENT LAW, PLLC

(57) ABSTRACT

An AlN ceramic substrate of the present invention contains yttrium aluminate, and has a volume resistivity of $3 \times 10^9$ $\Omega$cm or more at 550° C.

3 Claims, 7 Drawing Sheets

(56)                    References Cited

U.S. PATENT DOCUMENTS

| 2011/0034319 A1* | 2/2011 | Villalobos ......... C04B 35/62886 |
| | | 501/152 |
| 2013/0319762 A1 | 12/2013 | Harris et al. |
| 2019/0244847 A1 | 8/2019 | Yamana et al. |
| 2020/0303205 A1 | 9/2020 | Chae et al. |

FOREIGN PATENT DOCUMENTS

| JP | 2008-153194 A | 7/2008 |
| JP | 2015-514661 A | 5/2015 |
| JP | 6393006 B1 | 9/2018 |
| TW | 201904916 A | 2/2019 |

OTHER PUBLICATIONS

International Search Report and Written Opinion (Application No. PT/JP2021/040196) dated Dec. 14, 2021 (with English translation).
Taiwanese Office Action (Application No. 110141280) dated Nov. 2, 2022 (5 pages).

* cited by examiner

AlN CERAMIC SUBSTRATE AND HEATER FOR SEMICONDUCTOR MANUFACTURING APPARATUS

BACKGROUND OF THE INVENTION

1. Field of the Invention

The present invention relates to an AlN ceramic substrate and heater for semiconductor manufacturing apparatus.

2. Description of the Related Art

As indicated in PTL 1, there is known a heater for a semiconductor manufacturing apparatus, the heater including an AlN ceramic substrate and a resistance heating element embedded in the AlN ceramic substrate. Such a heater for a semiconductor manufacturing apparatus is used to heat a wafer placed on a surface of the AlN ceramic substrate. As indicated in PTL 2, there is also known a heater for a semiconductor manufacturing apparatus, the heater including an AlN ceramic substrate, and a resistance heating element and an electrostatic electrode embedded in the AlN ceramic substrate. In such heaters for semiconductor manufacturing apparatuses, the wafer would be damaged if current leaks from the resistance heating element to the wafer or from the electrostatic electrode to the wafer. Thus, the volume resistivity of the AlN ceramic substrate is preferably controlled to a high value. Regarding this point, PTL 3 discloses an AlN ceramic substrate obtained by granulating a mixed powder containing an AlN feedstock powder and an yttrium oxide powder that serves as a sintering additive, preparing a disk-shaped molded body by using the resulting granules, and hot-press firing the molded body at 1850 to 1890° C. The volume resistivity of this AlN ceramic substrate at 550° C. is as high as $1 \times 10^9$ to $2.6 \times 10^9$ $\Omega$cm.

CITATION LIST

Patent Literature

PTL 1: JP 2008-153194 A
PTL 2: JP 2005-281046 A
PTL 3: JP 6393006 B

SUMMARY OF THE INVENTION

However, when an AlN ceramic substrate that has a volume resistivity of $1 \times 10^9$ to $2.6 \times 10^9$ $\Omega$cm at 550° C. is used, there have been some instances where leakage current flowing in the AlN ceramic substrate could not be sufficiently prevented.

The present invention has been made to address such issues, and a main object is to provide an AlN ceramic substrate that has a yet higher volume resistivity at high temperature than in the related art.

An AlN ceramic substrate according to the present invention includes yttrium aluminate, wherein the AlN ceramic substrate has a volume resistivity of $3 \times 10^9$ $\Omega$cm or more at 550° C.

The volume resistivity of this AlN ceramic substrate is yet higher than in the related art. Thus, when this AlN ceramic substrate is used as an AlN ceramic substrate in which a resistance heating element of a heater for a semiconductor manufacturing apparatus is embedded, flow of the leakage current in the AlN ceramic substrate can be sufficiently prevented.

In addition, the volume resistivity is preferably $5 \times 10^9$ $\Omega$cm or more since the leakage current can be further suppressed, and is more preferably $1 \times 10^{10}$ $\Omega$cm or more since the thickness of the ceramic substrate can be further reduced. Furthermore, examples of yttrium aluminate include $Y_4Al_2O_9$ (YAM) and $YAlO_3$ (YAL).

In the AlN ceramic substrate of the present invention, AlN sintered grains preferably have an average grain size of 1.5 $\mu$m or more and 2.5 $\mu$m or less, and yttrium aluminate in a dispersed state is preferably present at grain boundaries between the AlN sintered grains. In this manner, yttrium aluminate assumes a refined and evenly dispersed state. Thus, generation of a current path of yttrium aluminate can be prevented, and the volume resistivity of the AlN ceramic substrate at high temperature can be increased.

A heater for a semiconductor manufacturing apparatus according to the present invention includes the aforementioned AlN ceramic substrate, and a resistance heating element embedded in the AlN ceramic substrate.

According to this heater for a semiconductor manufacturing apparatus, the volume resistivity of the AlN ceramic substrate at high temperature is yet higher than in the related art. Thus, flow of the leakage current in the AlN ceramic substrate can be sufficiently prevented.

In the heater for a semiconductor manufacturing apparatus according to the present invention, the resistance heating element is preferably a Mo resistance heating element, and, in the AlN ceramic substrate, a first annular layer that is in contact with and surrounds the resistance heating element and a second annular layer that surrounds the first annular layer are preferably present, and the first annular layer preferably has a higher Y content and a larger layer width than the second annular layer. The first annular layer may continuously surround the resistance heating element, and the second annular layer may continuously surround the first annular layer. The second annular layer may have an annular-shape with some missing portions, and may have a shape that forms one ring (smooth ring) if the missing portions are hypothetically connected. Furthermore, the average value of the Y content per unit width distributed in the width direction of the first annular layer may be larger than the average value of the Y content per unit width distributed in the width direction of the second annular layer.

DETAILED DESCRIPTION OF THE INVENTION

Figure 1:
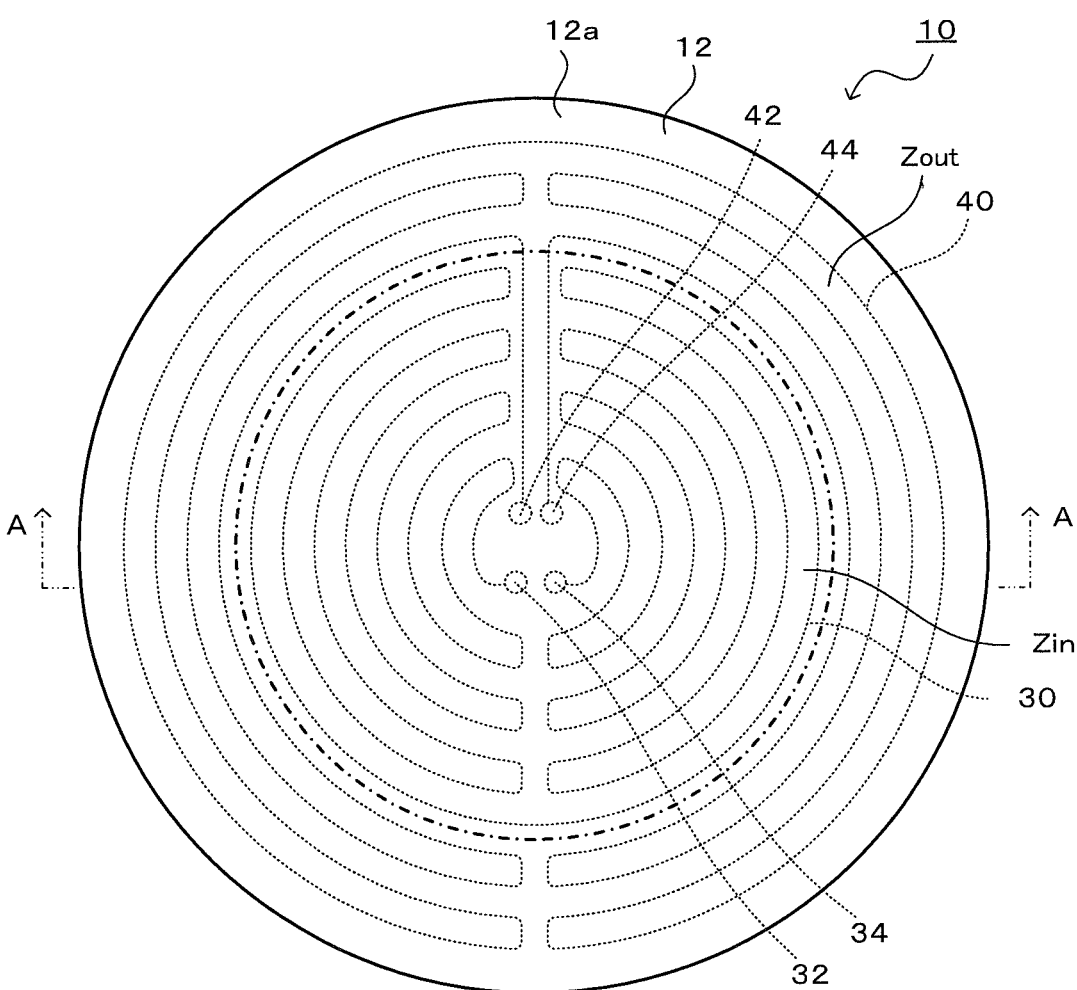
FIG. 1 is a plan view of a heater 10 for a semiconductor manufacturing apparatus.
Figure 2:
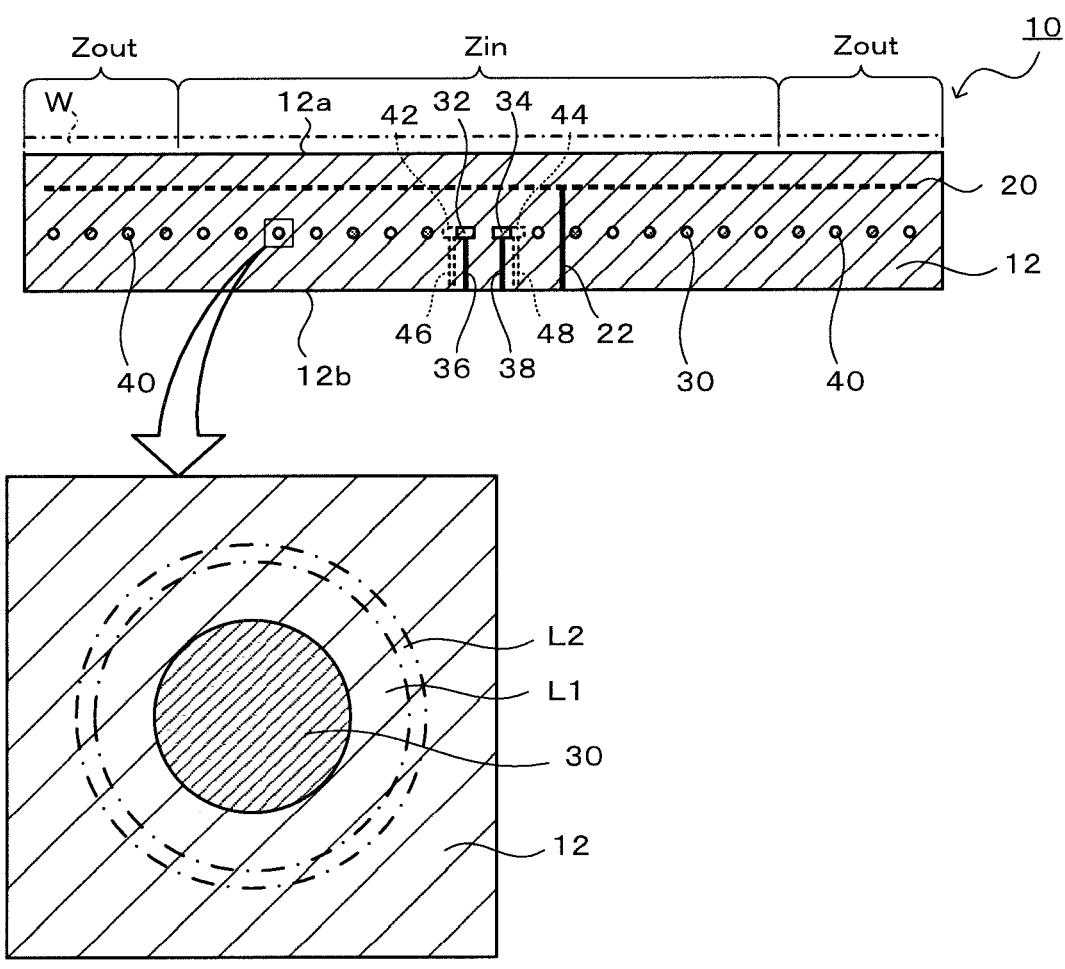
FIG. 2 is a cross-sectional view taken at A-A in FIG. 1.

A heater 10 for a semiconductor manufacturing apparatus, which is one preferable embodiment of the present invention, will now be described. FIG. 1 is a plan view of a heater 10 for a semiconductor manufacturing apparatus, and FIG. 2 is a cross-sectional view taken at A-A in FIG. 1. Note that a dash-dotted line in FIG. 1 indicates a zone boundary. In addition, while inner-peripheral-side and outer-peripheral-side resistance heating elements 30 and 40 are indicated by hidden outlines (dotted lines) in FIG. 1, an RF electrode 20 is omitted from the illustration.

The heater 10 for a semiconductor manufacturing apparatus includes a disk-shaped AlN ceramic substrate 12, and the RF electrode 20, the inner-peripheral-side resistance heating element 30, and the outer-peripheral-side resistance heating element 40 embedded in the AlN ceramic substrate 12.

The AlN ceramic substrate 12 contains yttrium aluminate (for example, YAL or YAM), and has a wafer placement surface 12a formed at the upper surface. The volume resistivity of the AlN ceramic substrate 12 at 550° C. is $3\times10^9$ $\Omega$cm or more, preferably $5\times10^9$ $\Omega$cm or more, and more preferably $1\times10^{10}$ $\Omega$cm or more. When viewed from above, the AlN ceramic substrate 12 is divided into an inner-peripheral-side zone Zin and an outer-peripheral-side zone Zout. The inner-peripheral-side zone Zin is a circular zone, and the diameter thereof is smaller than the diameter of the AlN ceramic substrate 12. The outer-peripheral-side zone Zout is an annular zone surrounding the inner-peripheral-side zone Zin.

The RF electrode 20 is a circular metal mesh (for example, a Mo coil), and is arranged substantially parallel to the wafer placement surface 12a. The RF electrode 20 is close to the wafer placement surface 12a than the inner-peripheral-side resistance heating element 30 and the outer-peripheral-side resistance heating element 40 are. The diameter of the RF electrode 20 is slightly smaller than the diameter of the AlN ceramic substrate 12. A high-frequency voltage is applied between the RF electrode 20 and a parallel plate electrode (not illustrated) arranged to be spaced from the wafer placement surface 12a. The RF electrode 20 is coupled to an RF connecting member 22. The RF connecting member 22 has an upper end connected to the lower surface of the RF electrode 20, and a lower end exposed from a lower surface 12b of the AlN ceramic substrate 12. The RF connecting member 22 is arranged to pass through a gap in the wiring pattern of the inner-peripheral-side resistance heating element 30. When applying a high frequency voltage between the RF electrode 20 and the parallel plate electrode, the RF connecting member 22 is used.

The inner-peripheral-side resistance heating element 30 is a metal coil (for example, a Mo coil) and is arranged substantially parallel to the wafer placement surface 12a. The inner-peripheral-side resistance heating element 30 is arranged to extend from one of a pair of terminals 32 and 34 disposed near the center of the AlN ceramic substrate 12, is laid out throughout the entire inner-peripheral-side zone Zin in a one-stroke pattern without crossing, and then is arranged to reach the other one of the pair of terminals 32 and 34. The pair of terminals 32 and 34 are coupled to a pair of inner-peripheral-side connecting members 36 and 38. The lower ends of the pair of inner-peripheral-side connecting members 36 and 38 are exposed from the lower surface 12b of the AlN ceramic substrate 12. When inducing heat from the inner-peripheral-side resistance heating element 30, the pair of inner-peripheral-side connecting members 36 and 38 are used to apply voltage between the pair of terminals 32 and 34.

The outer-peripheral-side resistance heating element 40 is a metal coil (for example, a Mo coil) and is arranged substantially parallel to the wafer placement surface 12a. The outer-peripheral-side resistance heating element 40 is arranged to extend from one of a pair of terminals 42 and 44 disposed near the center of the AlN ceramic substrate 12 and pass through the inner-peripheral-side zone Zin to be withdrawn into the outer-peripheral-side zone Zout, is laid out throughout the entire outer-peripheral-side zone Zout in a one-stroke pattern without crossing, and then is arranged to return to the inner-peripheral-side zone Zin so as to reach the other one of the pair of terminals 42 and 44. The pair of terminals 42 and 44 are coupled to a pair of outer-peripheral-side connecting members 46 and 48. The lower ends of the pair of outer-peripheral-side connecting members 46 and 48 are exposed from the lower surface 12b of the AlN ceramic substrate 12. When inducing heat from the outer-peripheral-side resistance heating element 40, the pair of outer-peripheral-side connecting members 46 and 48 are used to apply voltage between the pair of terminals 42 and 44. The outer-peripheral-side resistance heating element 40 is disposed on the same plane as the inner-peripheral-side resistance heating element 30.

Next, an example of using the heater 10 for a semiconductor manufacturing apparatus is described. First, the heater 10 for a semiconductor manufacturing apparatus is installed in a chamber not illustrated in the drawing. Then a wafer W is placed on the wafer placement surface 12a of the heater 10 for a semiconductor manufacturing apparatus, and an external power supply is coupled to the connecting members 36 and 38 of the inner-peripheral-side resistance heating element 30 to apply voltage between the pair of terminals 32 and 34. At the same time, another external power supply is coupled to the connecting members 46 and 48 of the outer-peripheral-side resistance heating element 40 to apply voltage between the pair of terminals 42 and 44. As a result, the inner-peripheral-side resistance heating element 30 and the outer-peripheral-side resistance heating element 40 generate heat and heat the wafer W to a predetermined temperature. In this embodiment, the temperatures of the inner-peripheral-side zone Zin and the outer-peripheral-side zone Zout can be independently controlled. Under this condition, high-frequency voltage is applied between the RF electrode 20 and the parallel plate electrode not illustrated in the drawings and disposed above the wafer W with a space therebetween, and various processes necessary to manufacture semiconductor chips are performed on the wafer W. Upon completion of the processes, application of high-frequency voltage to the RF electrode 20 and application of voltage to the inner-peripheral-side and outer-peripheral-side resistance heating elements 30 and 40 are stopped, and the wafer W is removed from the wafer placement surface 12a.

Next, an example of manufacturing the heater 10 for a semiconductor manufacturing apparatus is described. First, an AlN feedstock powder is prepared. The AlN feedstock powder may contain small amounts of O, C, Ti, and Ca. The AlN feedstock powder preferably contains 0.65 to 0.90 mass % of O, 220 to 380 mass ppm of C, 95 mass ppm or less of Ti, and 250 mass ppm or less of Ca. The average particle size of the AlN feedstock powder is preferably set such that the average grain size of the AlN sintered grains after firing is 1.5 $\mu$m or more and 2.5 $\mu$m or less, and is preferably, for example, 1.5 $\mu$m or more and 2.0 $\mu$m or less.

Next, a $Y_2O_3$ powder serving as a sintering additive is added to the prepared AlN feedstock powder to obtain a mixed powder, and the mixed powder is spray-dried into granules. $Y_2O_3$ is added so that the amount thereof is 4 to 6 mass% relative to the entirety of the mixed powder. The average particle size of the $Y_2O_3$ powder is preferably on the sub-micrometer order. Wet mixing that uses an organic solvent or a dry mixing such as mixing in a ball mill or a vibrating mill, or dry bag mixing may be employed as the mixing method.

Next, the granules of the mixed powder are compacted while embedding the RF electrode 20 and the inner-peripheral-side and the outer-peripheral-side resistance heating elements 30 and 40 inside so as to prepare a molded body. This molded body is then fired into an AlN sintered body. As a result, the heater 10 for a semiconductor manufacturing apparatus is obtained. For example, hot press firing or the like can be employed as the firing method. The maximum temperature (firing temperature) during hot press firing is 1650° C. or higher and 1750° C. or lower, and is preferably set within the range of 1670° C. or higher and 1730° C. or lower. Preferably, the time for keeping the firing temperature is 0.5 to 100 hours, the press-pressure is 5 to 50 MPa, and the atmosphere is a nitrogen atmosphere or a vacuum atmosphere (for example, 0.13 to 133.3 Pa). In performing the hot press firing, the operation of keeping the temperature for at least 1 hour is preferably performed at least once before reaching the maximum temperature (the range from 1500° C. to a temperature 10° C. lower than the maximum temperature).

In the obtained SEM image of a cross section of the AlN ceramic substrate 12 of the obtained heater 10 for a semiconductor manufacturing apparatus, the average grain size of the AlN sintered grains is preferably 1.5 μm or more and 2.5 μm or less, and yttrium aluminate finer than the AlN sintered grains and in a dispersed state are preferably present at the grain boundaries between the AlN sintered grains. When the average grain size of the AlN sintered grains is larger than this, yttrium aluminate in a wet state is present at the grain boundaries between the AlN sintered grains, and a current path is easily formed; thus, the volume resistivity at high temperature does not sufficiently increase. In contrast, when the average grain size of the AlN sintered grains is 1.5 μm or more and 2.5 μm or less, yttrium aluminate in a dispersed state is present at the grain boundaries between the AlN sintered grains; thus, a current path is not formed, and the volume resistivity at high temperature increases sufficiently.

Furthermore, when Mo is used in the inner-peripheral-side and outer-peripheral-side resistance heating elements 30 and 40, a first annular layer L1 that continuously (without any break) surrounds and contacts the inner-peripheral-side resistance heating element 30 and a second annular layer L2 that continuously surrounds the first annular layer L1 appear in the AlN ceramic substrate 12, as illustrated in an enlarged view in FIG. 2. The first annular layer L1 has a higher Y content and a larger layer width than the second annular layer L2. In other words, the first annular layer L1 is an Y-rich layer, and the second annular layer L2 is an Y-poor layer. Such a microstructure is also observed around the outer-peripheral-side resistance heating element 40. The reason why the first annular layer L1 is an Y-rich layer is presumably as follows.

At a firing temperature exceeding 1750° C., the Y concentration in the region in contact with the inner-peripheral-side resistance heating element 30 formed of Mo decreases. At a firing temperature exceeding 1750° C., Mo, which has high affinity with oxygen, tries taking oxygen away from yttrium aluminate around Mo while yttrium aluminate around Mo moves away from Mo to prevent oxygen loss. Presumably thus, at a firing temperature exceeding 1750° C., the Y concentration in the region of the AlN ceramic substrate 12 in contact with the inner-peripheral-side resistance heating element 30 formed of Mo decreases. This may be one reason for failing to achieve sufficiently high volume resistivity at high temperature.

In contrast, at a firing temperature of 1650° C. or higher and 1750° C. or lower, the Y concentration in the region (first annular layer L1) in contact with the inner-peripheral-side resistance heating element 30 formed of Mo becomes relatively high. At a firing temperature of 1750° C. or lower, the reaction of Mo taking oxygen away from yttrium aluminate therearound rarely occurs, and thus it is considered that yttrium aluminate around Mo is not likely to move away from Mo. Presumably as a result, at a firing temperature of 1650° C. or higher and 1750° C. or lower, the Y concentration in the region (first annular layer L1) of the AlN ceramic substrate 12 in contact with the inner-peripheral-side resistance heating element 30 formed of Mo does not decrease and thus the region turns into an Y-rich layer. This may be one reason for achieving sufficiently high volume resistivity at high temperature.

According to the heater 10 for a semiconductor manufacturing apparatus of the embodiment described above, the volume resistivity of the AlN ceramic substrate 12 at high temperature (550° C.) is $3 \times 10^9$ Ωcm or more, and this is higher than in the related art. Thus, the flow of the leakage current in the AlN ceramic substrate 12 can be sufficiently prevented. In addition, the volume resistivity is preferably $5 \times 10^9$ Ωcm or more since the leakage current can be further suppressed, and is more preferably $1 \times 10^{10}$ Ωm or more since the thickness of the ceramic substrate can be further reduced.

The average grain size of the AlN sintered grains in the AlN ceramic substrate 12 is preferably 1.5 μm or more and 2.5 μm or less, and yttrium aluminate in a dispersed state is preferably present at the grain boundaries between the AlN sintered grains. In this manner, yttrium aluminate assumes a refined and evenly dispersed state. Thus, generation of a current path of yttrium aluminate can be prevented, and the volume resistivity of the AlN ceramic substrate 12 at high temperature can be increased.

Furthermore, the inner-peripheral-side and the outer-peripheral-side resistance heating elements 30 and 40 are preferably formed of Mo, a first annular layer L1 that continuously surrounds and contacts the resistance heating elements 30 and 40 and a second annular layer L2 that continuously surrounds the first annular layer L1 preferably appear in the AlN ceramic substrate 12, and the first annular layer L1 preferably has a higher Y content and a larger layer width than the second annular layer L2. Such a structure is considered to have some contributions to the high volume resistivity at high temperature. Such a structure is likely to occur when, in performing the hot press firing, the operation of keeping the temperature for at least 1 hour is performed at least once before reaching the maximum temperature (the range from 1500° C. to a temperature 10° C. lower than the maximum temperature).

Furthermore, the heater 10 for a semiconductor manufacturing apparatus is obtained by compacting a mixed powder of an AlN powder and a $Y_2O_3$ powder (the $Y_2O_3$ powder accounts for 4 mass % or more and 6 mass % or less of the entirety of the mixed powder) while embedding the RF electrode 20 and the inner-peripheral-side and outer-peripheral-side resistance heating elements 30 and 40 in the mixed powder to obtain a molded body, and then hot-press-firing the molded body by setting the maximum temperature during firing to 1650° C. or higher and 1750° C. or lower. Thus, a heater 10 for a semiconductor manufacturing apparatus with which flow of leakage current in the AlN ceramic substrate 12 can be sufficiently prevented can be relatively easily manufactured.

It goes without saying that the present invention should not be limited to these embodiments and can be implemented in various aspects within the technical scope of the present invention.

For example, in the embodiment described above, the RF electrode 20 is embedded in the AlN ceramic substrate 12; alternatively, the RF electrode 20 may be omitted, the RF electrode 20 may be replaced by an electrostatic electrode, or the RF electrode 20 may also be used as an electrostatic electrode. When an electrostatic electrode is provided, the wafer W can be chucked onto the wafer placement surface 12a by applying voltage to the electrostatic electrode.

Although a metal mesh is used as an example of the RF electrode 20 in the aforementioned embodiment, a metal plate may be employed instead. Furthermore, although metal coils are used as examples of the inner-peripheral-side and outer-peripheral-side resistance heating elements 30 and 40, metal ribbons or metal meshes may be employed instead. The RF electrode 20 and the inner-peripheral-side and outer-peripheral-side resistance heating elements 30 and 40 may be formed by printing a conductive paste into a predetermined shape or a predetermined pattern.

In the embodiment described above, the inner-peripheral-side resistance heating element 30 is embedded in the inner-peripheral-side zone Zin, and the outer-peripheral-side resistance heating element 40 is embedded in the outer-peripheral-side zone Zout; alternatively, the AlN ceramic substrate 12 may be divided into three or more zones, and a resistance heating element may be embedded in each zone. Alternatively, one resistance heating element may be laid out throughout the entirety of the AlN ceramic substrate 12 without dividing the AlN ceramic substrate 12 into multiple zones.

In the embodiment described above, the inner-peripheral-side resistance heating element 30 and the outer-peripheral-side resistance heating element 40 are embedded on the same plane; alternatively, these may be embedded on different planes.

In the embodiment described above, a heater 10 for a semiconductor manufacturing apparatus is described as an example; alternatively, an AlN ceramic substrate 12 alone may be manufactured without embedding the RF electrode 20 and the inner-peripheral-side and outer-peripheral-side resistance heating elements 30 and 40 in the AlN ceramic substrate 12.

Figure 3:
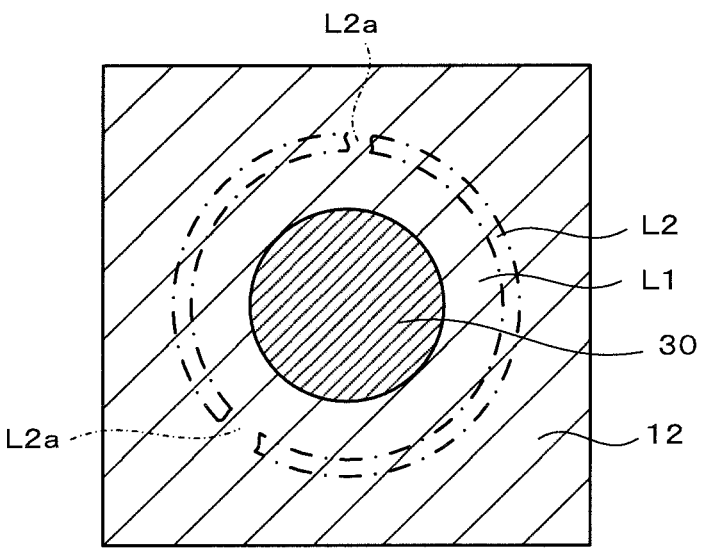
FIG. 3 is a cross-sectional view of a modification example of a second annular layer L2.

In the embodiment described above, the second annular layer L2 has a shape that continuously surrounds the first annular layer L1; however, the shape is not limited to this. For example, as illustrated in FIG. 3, the second annular layer L2 does not have to be continuous and may have a shape that has some missing portions L2a in the annular shape. The second annular layer L2 forms one ring (smooth ring) if the missing portions L2a are hypothetically connected.

EXAMPLES

Preferred examples of the present invention will now be described. The present invention is not limited by the examples below at all.

Example 1

First, an AlN feedstock powder was prepared. To the AlN feedstock powder, 5 mass % of a Y₂O₃ powder serving as a sintering additive was added, the resulting mixture was mixed in a ball mill to prepare a mixed powder, and the mixed powder was spray-dried into granules. $Y_2O_3$ was added so that the amount thereof was 5 mass % relative to the entirety of the mixed powder. Next, the granules of the mixed powder were prepared into a disk-shaped molded body. An RF electrode 20 and inner-peripheral-side and outer-peripheral-side resistance heating elements 30 and 40 were embedded in the molded body. The molded body was then hot-press fired to manufacture a heater 10 for a semiconductor manufacturing apparatus. In the hot-press firing, the maximum temperature (firing temperature) during firing was 1720° C., the time of keeping the firing temperature was 2 hours, the press pressure was 20 MPa, and the atmosphere was a nitrogen atmosphere. In the hot-press firing, the operation of keeping the temperature for 1 hour was performed at least twice before reaching the maximum temperature (the range from 1500° C. to a temperature 10° C. lower than the maximum temperature).

The crystal phases contained in the AlN ceramic substrate 12 were identified by X-ray diffraction. X-ray diffraction was performed on about 0.5 g of a powder using D8 ADVANCE produced by Bruker AXS. The measurement conditions were: a CuKα radiation source, a tube voltage of 40 kV, and a tube current of 40 mA. The measured results were analyzed by Rietveld refinement to identify and quantify the crystal phases. The crystal phases identified from the XRD profile were AlN, YAM, and YAL, and TiN was not identified.

Comparative Example 1

A heater for a semiconductor manufacturing apparatus was manufactured as in Example 1 except that the maximum temperature was changed to 1850° C. and the operation of keeping was not performed before reaching the maximum temperature. In Comparative Example 1 also, the crystal phases identified from the XRD profile were AlN, YAM, and YAL, and TiN was not identified.

[Volume Resistivity]

For the heater 10 for a semiconductor manufacturing apparatus obtained in Example 1, the volume resistivity of the AlN ceramic substrate 12 at 550° C. was measured. The measurement was conducted as follows. A Si wafer W was placed on the wafer placement surface 12a, and the leakage current (current flowing between the wafer W and the RF electrode 20) that flowed when voltage was applied between the wafer W and the RF electrode 20 (metal mesh) at 550° C. was measured. The diameter of the RF electrode 20 was φ355.6 mm, the thickness of the dielectric layer (the layer between the wafer placement surface 12a and the RF electrode 20) was 1.02 mm, and the applied voltage was 660 V. Multiple heaters 10 for a semiconductor manufacturing apparatus of Example 1 were manufactured, and the leakage current was measured. The leakage current was on the 40 mA order. The volume resistivity of the AlN ceramic substrate 12 at 550° C. was indirectly calculated from the leakage current, and the average value was $1.2 \times 10^{10}$ Ωcm. Meanwhile, the leakage current of Comparative Example 1 was also measured as in Example 1, and was on the 280 mA order, and the average value of the volume resistivity of the AlN ceramic substrate at 550° C. was $2.4 \times 10^9$ Ωcm.

[Microstructure]

The average grain size of the AlN sintered grains was determined from a SEM image of a Mo-containing cross section of the AlN ceramic substrate 12 of Example 1, and was 1.9 μm. Thus, in Example 1, it was determined that yttrium aluminate was evenly dispersed at grain boundaries between fine AlN sintered grains. The average grain size was also determined for Comparative Example 1 in the same manner, and was 4.5 μm, which was larger than Example 1. The average grain size was determined by acquiring a secondary electron image (magnification: 3000×), drawing a straight line on the image, measuring the length of each of segments crossing forty grains, and obtaining the average value therefrom.

Figure 4:
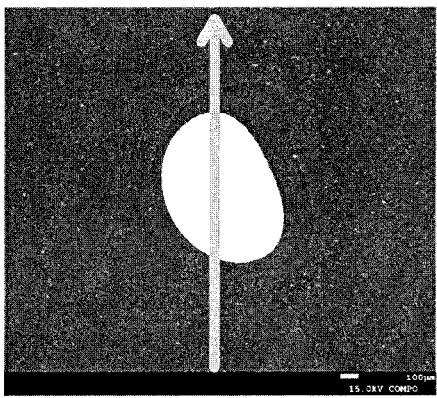
FIG. 4 is a SEM image of a Mo-containing cross section of an AlN ceramic substrate 12 of Example 1.
Figure 5:
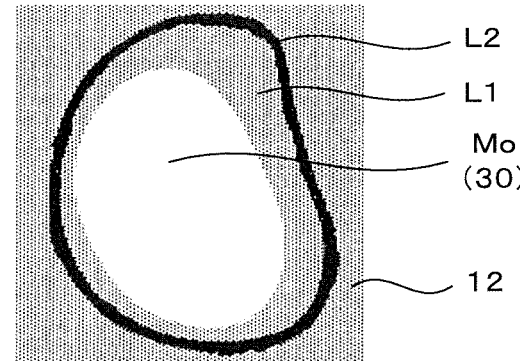
FIG. 5 is a schematic diagram of the Mo-containing cross section of the AlN ceramic substrate 12 of Example 1.
Figure 6:
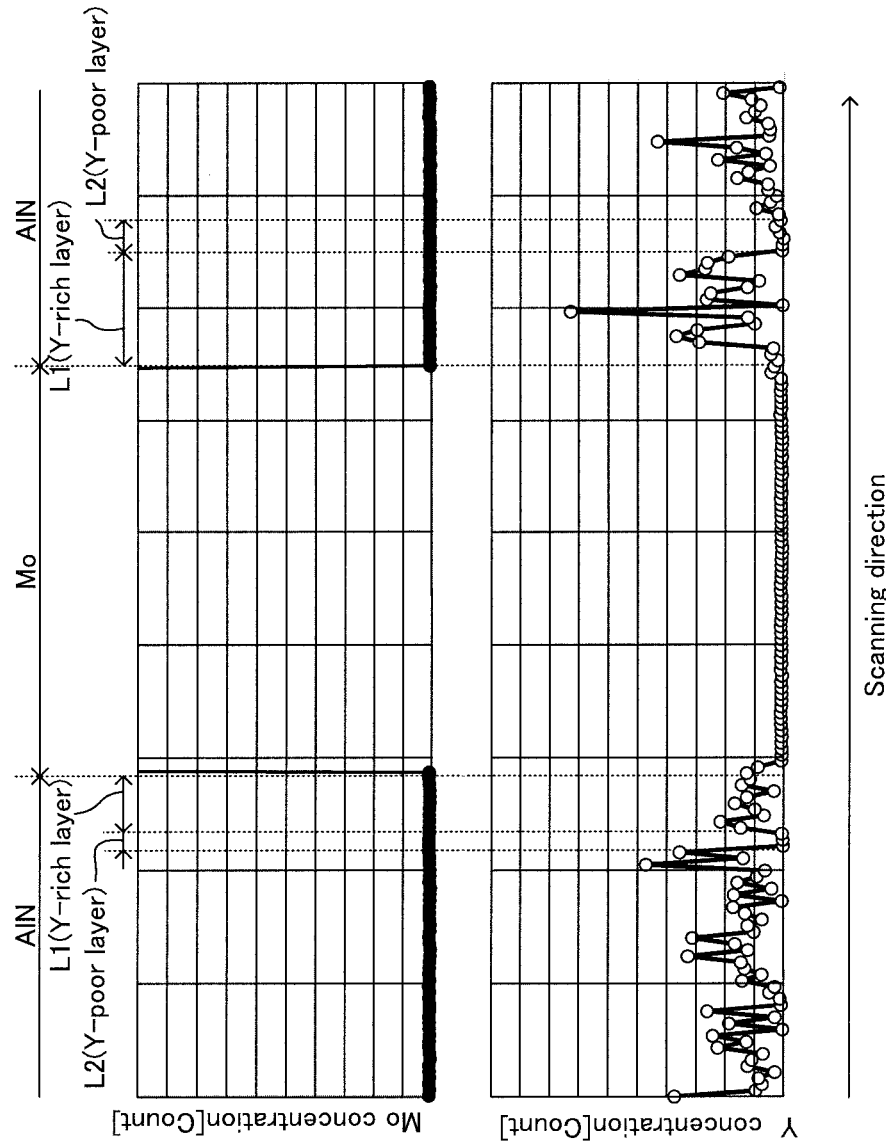
FIG. 6 is a graph indicating the results of EPMA analysis in Example 1.

FIG. 4 is a SEM image of a Mo (inner-peripheral-side resistance heating element 30)—containing cross section of the AlN ceramic substrate 12 of Example 1, and FIG. 5 is a schematic diagram thereof. As apparent from FIGS. 4 and 5, a first annular layer L1 that continuously (without any break) surrounded and contacted Mo and a second annular layer L2 that continuously surrounded the first annular layer L1 were observed. In the first annular layer L1, many white fine dots (Y derived from yttrium aluminate) were dispersed, but such dots were rarely found in the second annular layer L2, and the second annular layer L2 was close to black. FIG. 6 is a graph indicating the results of EPMA analysis performed for Mo and Y in the arrow direction in FIG. 4. In FIG. 6, a portion where the Mo concentration steeply rose and a portion where the Mo concentration sharply dropped were deemed to be the boundaries between the resistance heating element (Mo) and the AlN ceramic sintered body. Although the Y concentration in the first annular layer L1 was relatively high, the Y concentration in the second annular layer L2 was close to zero. This shows that the first annular layer L1 is an Y-rich layer, and the second annular layer L2 is an Y-poor layer. The layer width of the first annular layer L1 was larger than the layer width of the second annular layer L2.

Figure 7:
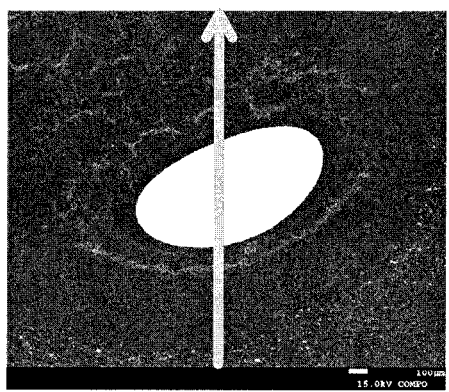
FIG. 7 is a SEM image of a Mo-containing cross section of an AlN ceramic sintered body of Comparative Example 1.
Figure 8:
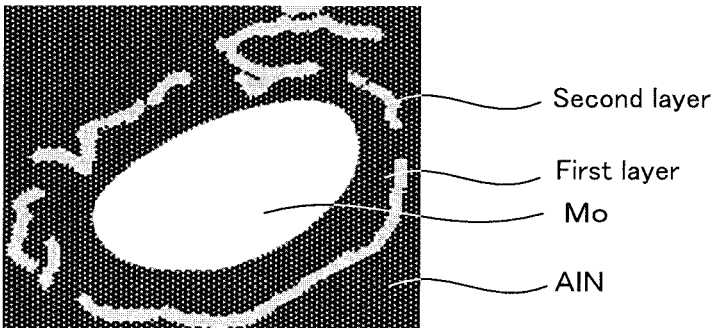
FIG. 8 is a schematic diagram of the Mo-containing cross section of the AlN ceramic sintered body of Comparative Example 1.
Figure 9:
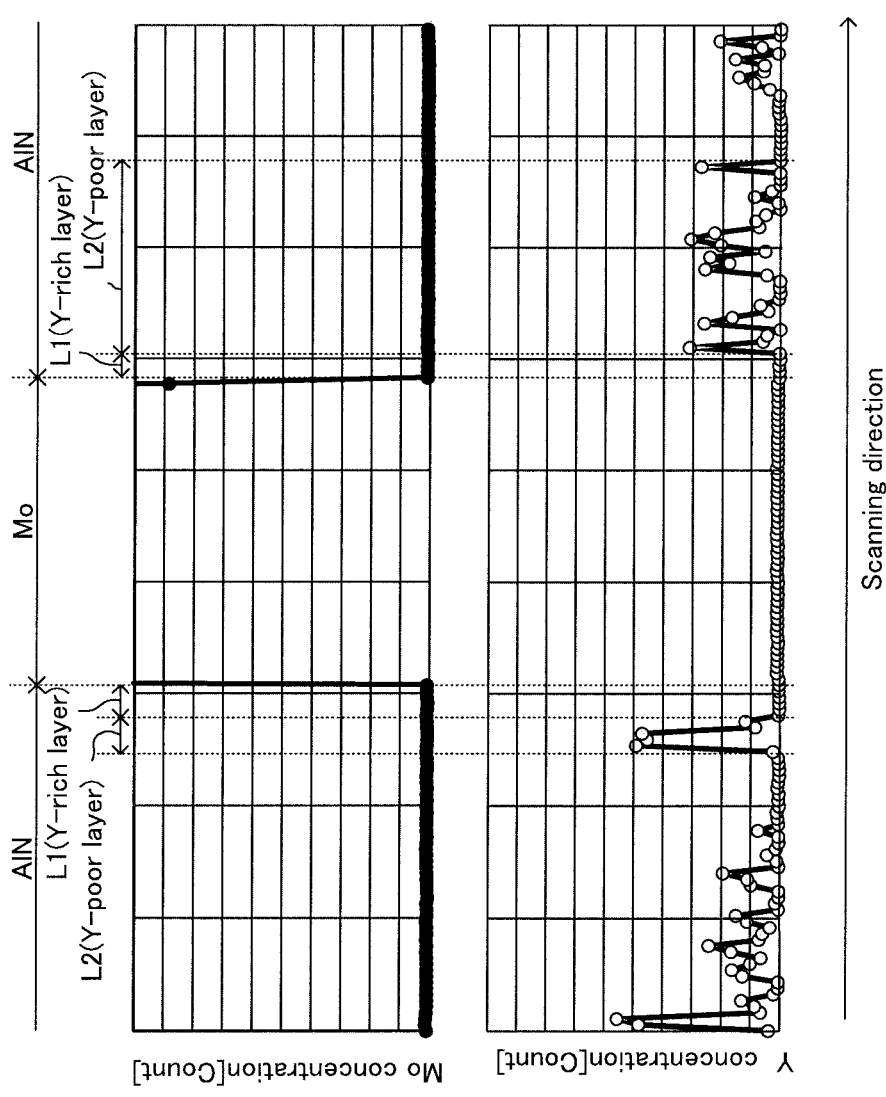
FIG. 9 is a graph indicating the results of EPMA analysis in Comparative Example 1.

FIG. 7 is a SEM image of a Mo-containing cross section of the AlN ceramic sintered body of Comparative Example 1, and FIG. 8 is a schematic diagram thereof. As apparent from FIGS. 7 and 8, a first layer that continuously surrounded and contacted Mo and a second layer that continuously surrounded the first layer were observed. The first layer was substantially free of dots and was close to black, and the second layer had relatively many dots. The second layer was not continuous and was discontinuous. FIG. 9 indicates the results of EPMA analysis performed for Mo and Y along the arrow direction in FIG. 7. In FIG. 9, a portion where the Mo concentration rose steeply and a portion where the Mo concentration dropped sharply were deemed to be the boundaries between the resistance heating element (Mo) and the AlN sintered body. The Y concentration in the first layer was close to zero, and the Y concentration in the second layer was relatively high. This shows that the first layer in Comparative Example 1 is an Y-poor layer, and the second layer is an Y-rich layer, in other words, opposite to Example 1.

The present application claims priority from Japanese Patent Application No. 2021-44405, filed on Mar. 18, 2021, the entire contents of which are incorporated herein by reference.

What is claimed is:

1. A heater for a semiconductor manufacturing apparatus comprising an aluminum nitride ceramic substrate including yttrium aluminate, wherein the aluminum nitride ceramic substrate has a volume resistivity of $3 \times 10^9$ Ωcm or more at 550° C., and a resistance heating element embedded in the aluminum nitride ceramic substrate, wherein:

the resistance heating element is formed of molybdenum, and in the aluminum nitride ceramic substrate, a first annular layer that is in contact with and surrounds the resistance heating element, and a second annular layer that surrounds the first annular layer are present, and the first annular layer has a higher yttrium content and a larger layer width than the second annular layer.

2. The heater for a semiconductor manufacturing apparatus according to claim 1, wherein:

the aluminum nitride sintered grains have an average grain size of 1.5 μm or more and 2.5 μm or less, and the yttrium aluminate in a dispersed state is present at grain boundaries between the aluminum nitride sintered grains.

3. The heater for a semiconductor manufacturing apparatus according to claim 1, wherein:

the first annular layer continuously surrounds the resistance heating element, and the second annular layer continuously surrounds the first annular layer.

\* \* \* \* \*